United States Patent
Rebeyrotte et al.

(10) Patent No.: US 9,526,190 B2
(45) Date of Patent: Dec. 20, 2016

(54) ELECTRONIC BOARD FOR AVIONICS EQUIPMENT COMPRISING VIBRATION DAMPING MEANS BETWEEN ITS REINFORCING SURROUND AND ITS RETENTION MEANS

(71) Applicant: Airbus Operations (SAS), Toulouse (FR)

(72) Inventors: Vincent Rebeyrotte, Colomiers (FR); Jonathan Carcone, Toulouse (FR)

(73) Assignee: AIRBUS OPERATIONS (SAS), Toulouse (FR)

( * ) Notice: Subject to any disclaimer, the term of this patent is extended or adjusted under 35 U.S.C. 154(b) by 0 days.

(21) Appl. No.: 14/166,196

(22) Filed: Jan. 28, 2014

(65) Prior Publication Data

US 2014/0214244 A1    Jul. 31, 2014

(30) Foreign Application Priority Data

Jan. 29, 2013  (FR) ...................................... 13 50753

(51) Int. Cl.
| | |
|---|---|
| H05K 1/02 | (2006.01) |
| H05K 7/14 | (2006.01) |
| B64C 19/00 | (2006.01) |
| H05K 7/20 | (2006.01) |

(52) U.S. Cl.
CPC ............ *H05K 7/1422* (2013.01); *B64C 19/00* (2013.01); *H05K 1/0271* (2013.01); *H05K 7/1404* (2013.01); *H05K 7/20563* (2013.01)

(58) Field of Classification Search
CPC .. H05K 7/1422; H05K 1/0271; H05K 7/1404; H05K 7/20563; H05K 7/14; H05K 1/02; B64C 19/00
See application file for complete search history.

(56) References Cited

U.S. PATENT DOCUMENTS

| | | | | |
|---|---|---|---|---|
| 4,083,272 | A * | 4/1978 | Miller | B23Q 1/28 33/638 |
| 4,096,547 | A | 6/1978 | Calabro | |
| 4,141,150 | A * | 2/1979 | Miller | B23Q 1/28 33/558 |
| 4,142,296 | A * | 3/1979 | Miller | B23Q 1/28 33/502 |
| 4,330,987 | A * | 5/1982 | Schippers | D01H 13/04 57/1 R |
| 4,332,129 | A * | 6/1982 | Schipper | B65H 54/20 57/1 R |

(Continued)

FOREIGN PATENT DOCUMENTS

| | | |
|---|---|---|
| EP | 2421350 | 2/2012 |
| FR | 1594979 | 6/1970 |

(Continued)

OTHER PUBLICATIONS

French Search Report, Oct. 23, 2013.

*Primary Examiner* — Jean-Paul Cass
(74) *Attorney, Agent, or Firm* — Greer Burns & Crain, Ltd.

(57) ABSTRACT

An electronic board for avionics equipment, the board comprising a printed circuit, a reinforcing surround and board retention means. In order to improve the vibration resistance of the board, the board further comprises vibration damping means interposed between the reinforcing surround and the retention means.

17 Claims, 6 Drawing Sheets

(56) References Cited

U.S. PATENT DOCUMENTS

| | | | | |
|---|---|---|---|---|
| 4,372,405 A * | 2/1983 | Stuart | ............... | G01G 3/12 177/207 |
| 4,710,853 A * | 12/1987 | Reinhardt | ............ | H05K 7/1425 206/821 |
| 4,771,365 A * | 9/1988 | Cichocki | ............ | H05K 7/20545 165/80.3 |
| 5,320,226 A * | 6/1994 | Merrill | ................... | B65D 81/05 206/521 |
| 5,559,671 A * | 9/1996 | Dan | ........................ | F16F 1/128 248/562 |
| 5,654,875 A * | 8/1997 | Lawson | ............... | G11B 33/124 248/638 |
| 5,867,369 A * | 2/1999 | Antonuccio | ............ | G06F 1/184 312/223.2 |
| 6,078,498 A * | 6/2000 | Eckerd | ................ | G11B 33/124 248/632 |
| 6,392,892 B1 * | 5/2002 | Sobolewski | ........... | G11B 5/584 248/634 |
| 6,600,661 B1 * | 7/2003 | Deeney | ................... | H01L 23/32 257/718 |
| 7,983,033 B2 * | 7/2011 | Antonuccio | ......... | G11B 33/124 312/223.2 |
| 8,369,069 B2 * | 2/2013 | Osternack | ........... | H05K 7/1424 244/1 R |
| 2002/0172006 A1 * | 11/2002 | Ives | ....................... | G11B 33/08 361/679.33 |
| 2004/0050569 A1 * | 3/2004 | Leyda | ................ | H05K 7/20563 174/50 |
| 2008/0259554 A1 * | 10/2008 | Qin | ........................ | G06F 1/187 361/679.34 |
| 2009/0257185 A1 * | 10/2009 | Signer | .................... | G06F 1/181 361/679.32 |
| 2012/0069519 A1 | 3/2012 | Caron et al. | | |
| 2012/0285132 A1 * | 11/2012 | Rebeyrotte | ........ | H05K 7/20181 55/385.1 |
| 2012/0285665 A1 * | 11/2012 | Rebeyrotte | ........ | H05K 7/20563 165/104.34 |
| 2013/0077300 A1 * | 3/2013 | Meyer | ...................... | F21K 9/50 362/235 |
| 2013/0144751 A1 * | 6/2013 | Gorjanc | ............... | A47C 31/123 705/26.7 |
| 2013/0194059 A1 * | 8/2013 | Parr | ........................ | H02B 1/52 336/65 |
| 2013/0284501 A1 * | 10/2013 | McConnell | .......... | H05K 1/0271 174/255 |
| 2014/0062271 A1 * | 3/2014 | Warren | .................... | H02G 3/08 312/223.1 |

FOREIGN PATENT DOCUMENTS

| | | |
|---|---|---|
| FR | 2630618 | 10/1989 |
| FR | 3001603 A1 * | 8/2014 |

* cited by examiner

ELECTRONIC BOARD FOR AVIONICS EQUIPMENT COMPRISING VIBRATION DAMPING MEANS BETWEEN ITS REINFORCING SURROUND AND ITS RETENTION MEANS

CROSS-REFERENCES TO RELATED APPLICATIONS

This application claims the benefit of the French patent application No. 20130050753 filed on Jan. 29, 2013, the entire disclosures of which are incorporated herein by way of reference.

BACKGROUND OF THE INVENTION

The present invention relates to the field of damping the vibrations of electronic equipment onboard aircraft, this equipment usually being referred to as "avionics equipment."

Aircraft electronic equipment is generally mounted in an avionics rack module, and associated with an air duct used to cool it. This is notably the case of the electronic equipment that meets aeronautical standard ARINC600, an example of which is briefly described in document US-A-2012285665.

Such equipment comprises a chassis, also referred to as a "rack," into which several electronic boards are plugged using slide rails provided on the boards and collaborating with guide rails forming a slideway with which the chassis is equipped. The latter is usually mounted on a chair in the avionics rack module, this chair supporting it mechanically and providing the electrical connection for the equipment to the aircraft electrical network.

Such electronic equipment is exposed to the vibrations of the airplane. In order to reduce its sensitivity to vibrations, this equipment is usually stiffened, by fitting stiffeners, strengtheners or the like. For example, an electronic board may, in the peripheral part of its printed circuit, be equipped with a reinforcing surround aimed at reducing the deformations of this board under vibrational stress, notably in the critical zones which are sensitive to deformations and to relative movement between components. Such a reinforcing surround ensures that the first natural frequencies of the board are high enough to limit the sensitivity of the board to lower-frequency vibrational stresses.

Nevertheless, there is a need to improve the vibration resistance of avionics equipment still further.

SUMMARY OF THE INVENTION

In order to address this series of problems, the subject matter of the invention is an electronic board for avionics equipment, the board comprising a printed circuit, a reinforcing surround and board retention means, and further comprises vibration damping means interposed between the reinforcing surround and the retention means.

The invention thus proposes to perform mechanical vibration damping directly at the interface between the reinforcing surround and the board retention means, the latter holding the board in the avionics equipment. In this way, the invention makes it possible significantly to reduce the accelerations/vibrations that can be transmitted to the board by the means of the equipment that support this board. As a result, the mechanical resistance of the components of the electronic board is enhanced and their reliability improved.

For preference, the invention comprises at least one of the following optional features, considered in isolation or in combination.

The said damping means take the form of at least one coating of vibration damping material. Alternatively, they may be mechanical means providing such a vibration damping function.

The said vibration damping material is a polymer material.

The said vibration damping material has a density, in the neutral state, of between 0.8 g/cm$^3$ and 1.8 g/cm$^3$ and is compressed between the reinforcing surround and the retention means with a compression ratio of the order of 15 to 25%.

The said reinforcing surround comprises an outwardly projecting flange, on either side of which first and second vibration damping means are pressed.

The said retention means comprise two mechanical components mounted one on the other and clamping the said flange and the first and second vibration damping means.

The said retention means additionally comprise a locking piece intended to lock the board in complementary retention means belonging to the avionics equipment, the said locking piece being attached to one and/or the other of the said two mechanical components.

The board comprises two retention means arranged respectively on two opposite sides of the reinforcing surround.

The said retention means adopt the overall form of a rail, preferably a slide rail so that the board can be plugged into the equipment by sliding.

The board also comprises electronic components connected to the printed circuit, and a board connector.

Another subject of the invention is an item of avionics equipment comprising a chassis equipped with complementary retention means, the said equipment also comprising at least one electronic board as described hereinabove, the said board being housed in the chassis by collaboration between its retention means and the said complementary retention means.

For preference, the chassis has an opening opposite a chassis backplane, the opening being delimited in part by two opposite walls each one extending as far as the chassis backplane, each electronic board having two retention means respectively collaborating with two complementary retention means provided on the two opposite walls.

For preference, the retention means and the complementary retention means are designed to slide on one another in a plug-in direction of the board into the said chassis, the retention means preferably adopting the overall form of a slide rail, male or female, and the complementary retention means preferably adopting the form of a guide rail guiding the slide rail. Nevertheless, solutions other than rails are conceivable for plugging in the board by sliding, without departing from the scope of the invention. For example, the complementary retention means of the chassis could adopt the form of several discrete guide elements spaced apart in the plug-in direction.

For preference, the chassis backplane is equipped with at least one connector collaborating with an electronic board of the equipment. That allows the board to be plugged into the said connector of the chassis backplane.

Another subject of the invention is an avionics rack module comprising at least one item of electronic equipment as mentioned hereinabove, and a cooling air duct running along each item of electronic equipment, the latter preferably being mounted on a support chair.

Finally, a subject of the invention is an aircraft comprising at least one such avionics rack module.

Other advantages and features of the invention will become apparent from the nonlimiting detailed description below.

BRIEF DESCRIPTION OF THE DRAWINGS

This description will be given with reference to the attached drawings among which.

DETAILED DESCRIPTION OF THE PREFERRED EMBODIMENTS

Reference is made first of all to FIGS. 1 to 4 which depict part of an avionics rack module 100 according to a preferred embodiment of the present invention.

These figures more specifically show avionics equipment 2 mounted on a support chair 9 of a shelf. This shelf 1 comprises a bent metal section piece 5 adopting the shape of a channel flanked by two vertical banks and two lateral flanges intended to bear electrical equipment such as the equipment 2.

The chair 9 acts as a mechanical and electrical interface for the equipment 2 intended to be slid in the hollow of this chair. It is placed on the lateral flanges of the shelf 1. It has a vertical part 6 forming a backrest, connected by an angle bracket 6a and an angle bracket 6b to a horizontal part 7 forming a seat.

The chair 9 is for example fixed by screws to the lateral flanges of the shelf 1 and is constructed to accept the electronic equipment 2, which in this instance is designed to comply with standard ARINC600.

As will be detailed later on, the equipment 2 mainly comprises a chassis 15 formed of a metal cover which is closed in a lower part by a base bearing guide rails that form slideways. Each guide rail holds a removable electronic board 10, and is also used for sliding this board so as to insert/extract it into/from the chassis. The board 10 is said to be plugged into the chassis of the avionics equipment.

Figure 1:
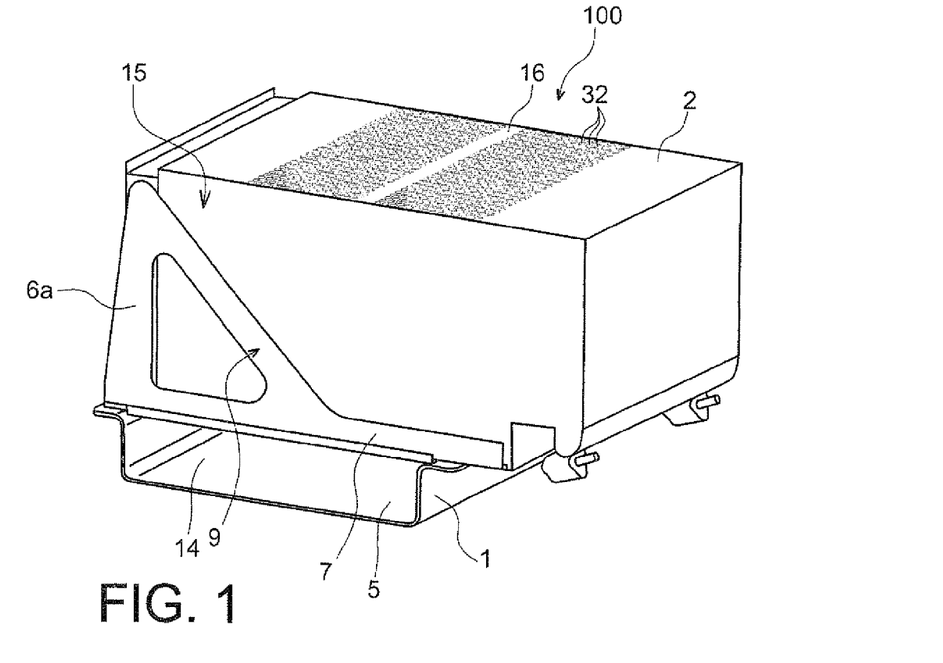
FIG. 1 depicts a schematic side view of part of an avionics rack module according to one preferred embodiment of the invention.
Figure 2:
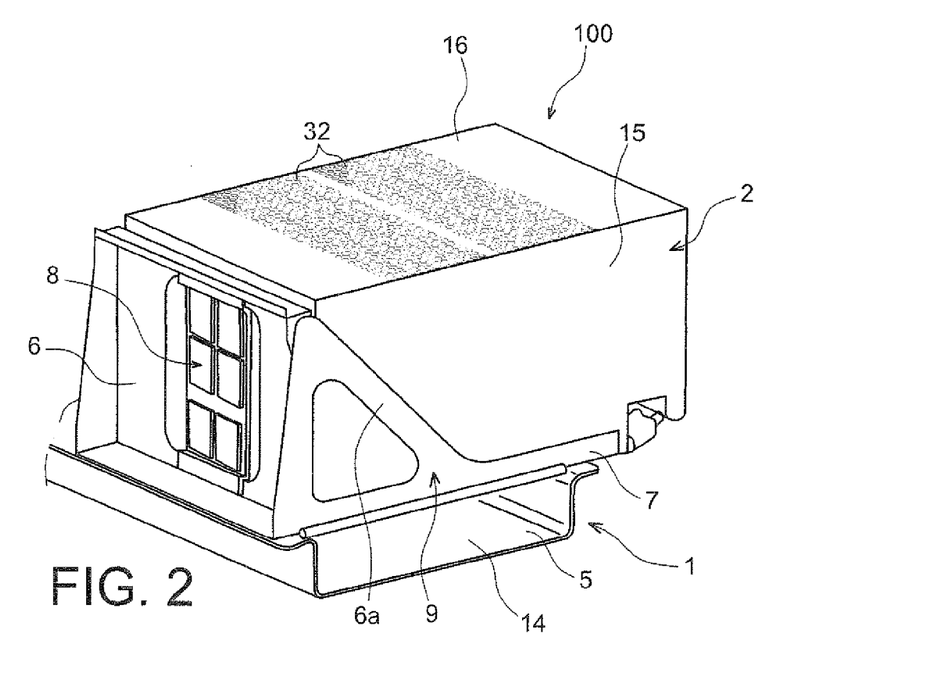
FIG. 2 depicts a perspective view of the avionics rack module shown in the preceding figure, without the electronic equipment.
Figure 3:
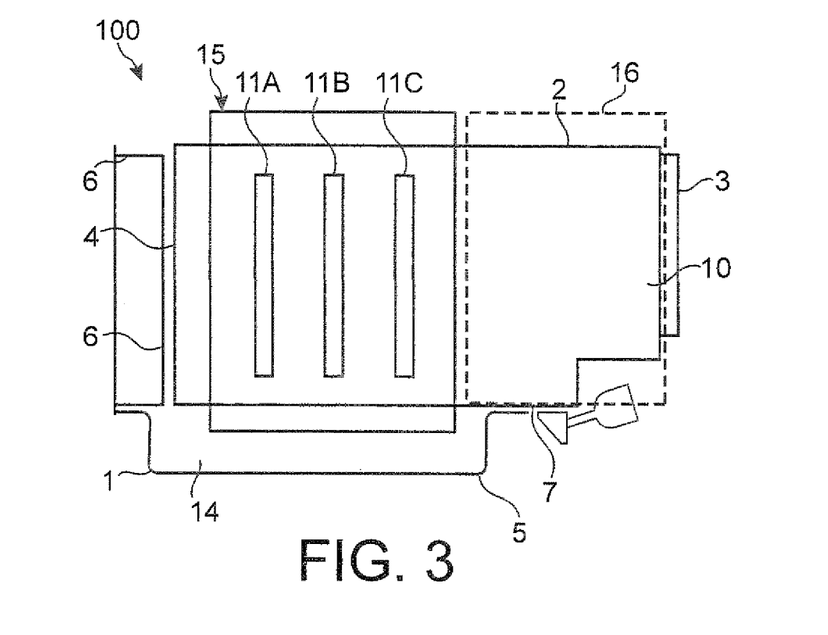
FIGS. 3 and 4 depict perspective views of the avionics rack module shown in the preceding figures, from two distinct viewpoints.

With reference more especially to FIG. 3, the electronic board 10 comprises a printed circuit on which are mounted a multitude of electronic components, for example arranged in rows 11A, 11B and 11C, and connected by soldering to the printed circuit.

The equipment 2 has a chassis backplane equipped with a connector 4 that allows all the electronic boards 10 of the equipment to be connected to an avionics connector which has not been depicted in this FIG. 3. Connection is achieved as the equipment 2 is mounted on the chair 9, and as it is inserted into the avionics connector 8 depicted in FIGS. 2 and 4. This connector 8, with which the backrest of the chair 9 is equipped, is intended to be connected to the electrical network of the airplane.

Figure 4:
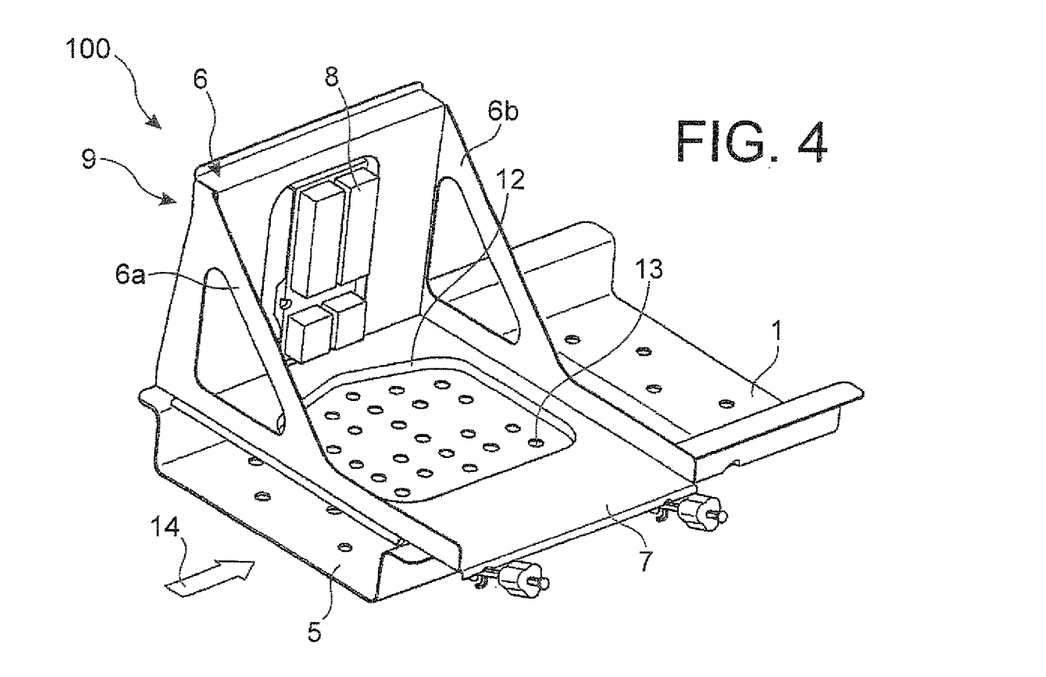

As can best be seen in FIG. 4, the seat 7 of the chair 9 has, above the channel formed in the shelf 1 and which acts as a cooling air duct 14 for cooling the rack module 100, a hollow part 12 which is provided with a plurality of holes 13 for the passage of air. This part in fact constitutes a zone in which air passes between the ventilation stream and the equipment 2. In this respect it should be noted that depending on the power dissipated by the equipment, some of the holes 13 in the seat 7 may be plugged and others may be opened so that the pressure drop between the stream of air 14 and the flow of cooling air injected into the equipment 2 can be controlled. To do that, the lower part of the equipment 2 is provided with slots along the spaces between the guide rails. The result of this arrangement is that cold air is tapped from the stream 14 and flows vertically along the electronic components of the boards that produce heat as they operate.

Likewise, the upper part 16 of the chassis 15 of the electrical equipment is provided with holes for discharging the cooling air after it has passed over the components that need to be cooled.

In the usual case in which the avionics rack module comprises a plurality of items of electronic equipment 2 arranged one beside the next, the cooling air duct 14 then runs along each of these items of equipment in order to cool the boards 10 and their components. Each item of equipment 2 is also mounted on the rack module via a support chair 9 as described hereinabove, mounted on the duct 14 that it defines in part via its holed seat 7 that covers the opening of the section piece 5.

Figure 5:
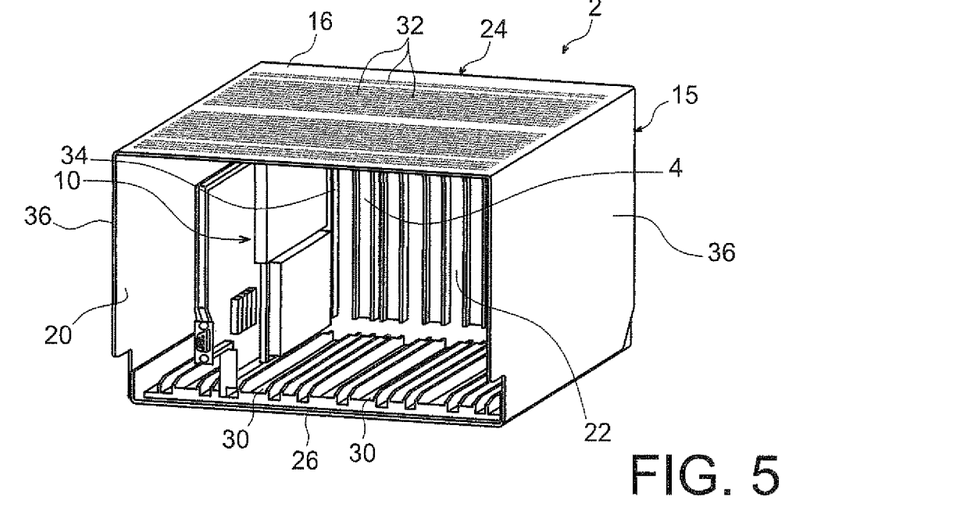
FIG. 5 depicts a perspective view of a part of the electronic equipment of the rack module depicted in the preceding figures, with just one electronic board fitted into the chassis.

FIG. 5 shows in greater detail the equipment 2 which is of parallelepipedal overall shape in a shape that complements that of the hollow in the chair 9 intended to accept it. One of the faces of the rectangular parallelepiped formed by the chassis 15 defines an opening 20 which may or may not be plugged in operation. Facing this opening 20, a chassis backplane 22 is defined by a metal cover 24 which is closed at the bottom by a wall 26 forming the base that supports the guide rails 30 that form the slideways. It is this wall 26 that is pierced with slots (not depicted) along the spaces between the rails 30 for the passage of the stream of cooling air. The support rails 30 may be produced as a single piece with the wall 26 that forms the base or alternatively may be attached to this same wall 26, without departing from the scope of the invention.

Opposite the bottom wall 26, the cover 24 also comprises the top wall 16 equipped with the air discharge holes 32. Even though this is not visible in FIG. 5, the interior surface of the wall 16 is also preferably equipped with guide rails forming slideways, facing the rails 30 of the wall 26 in pairs. In this way, each board 10, of square or rectangular overall shape, can be plugged into/housed in the chassis 15 via two opposite guide rails which retain it and allow it to be inserted/extracted by sliding. To do this, each board comprises slide rails which collaborate pairwise with the guide rails 30, as will be detailed hereinafter.

The two opposite walls 16, 26 contribute to delimiting the opening 20 and extend as far as the chassis backplane 22 to which they are connected. Similarly, two more opposite walls 36, substantially orthogonal to the walls 16, 26, also contribute to defining the opening 20 and also extend as far as the backplane 22 to which they are connected.

The chassis backplane 22 is equipped with the connector 4 to which the connector 34 of each board 10 is connected, which connector is positioned at the rear of this board. Thus, the boards 10 are not only kept plugged into the chassis 15 by the rails, but are also plugged into the connector 4 of this chassis. As mentioned hereinabove, this connector 4 of the equipment 2 is designed to be connected to the connector 8 of the chair visible in FIGS. 2 and 4, for connection to the electrical network of the aircraft. It is specified that the guide rails 30 here are arranged substantially orthogonally to the slots of the connector 4.

Figure 6:
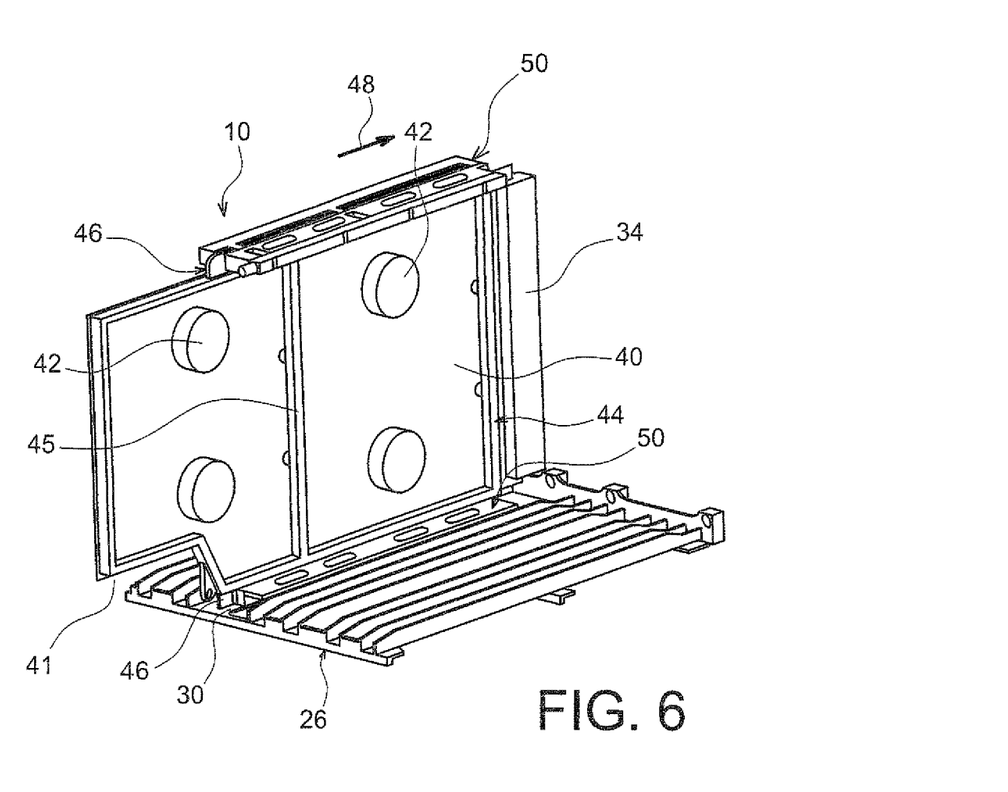
FIG. 6 is a cleaned-up view of FIG. 5, showing the electronic board in greater detail.
Figure 7:
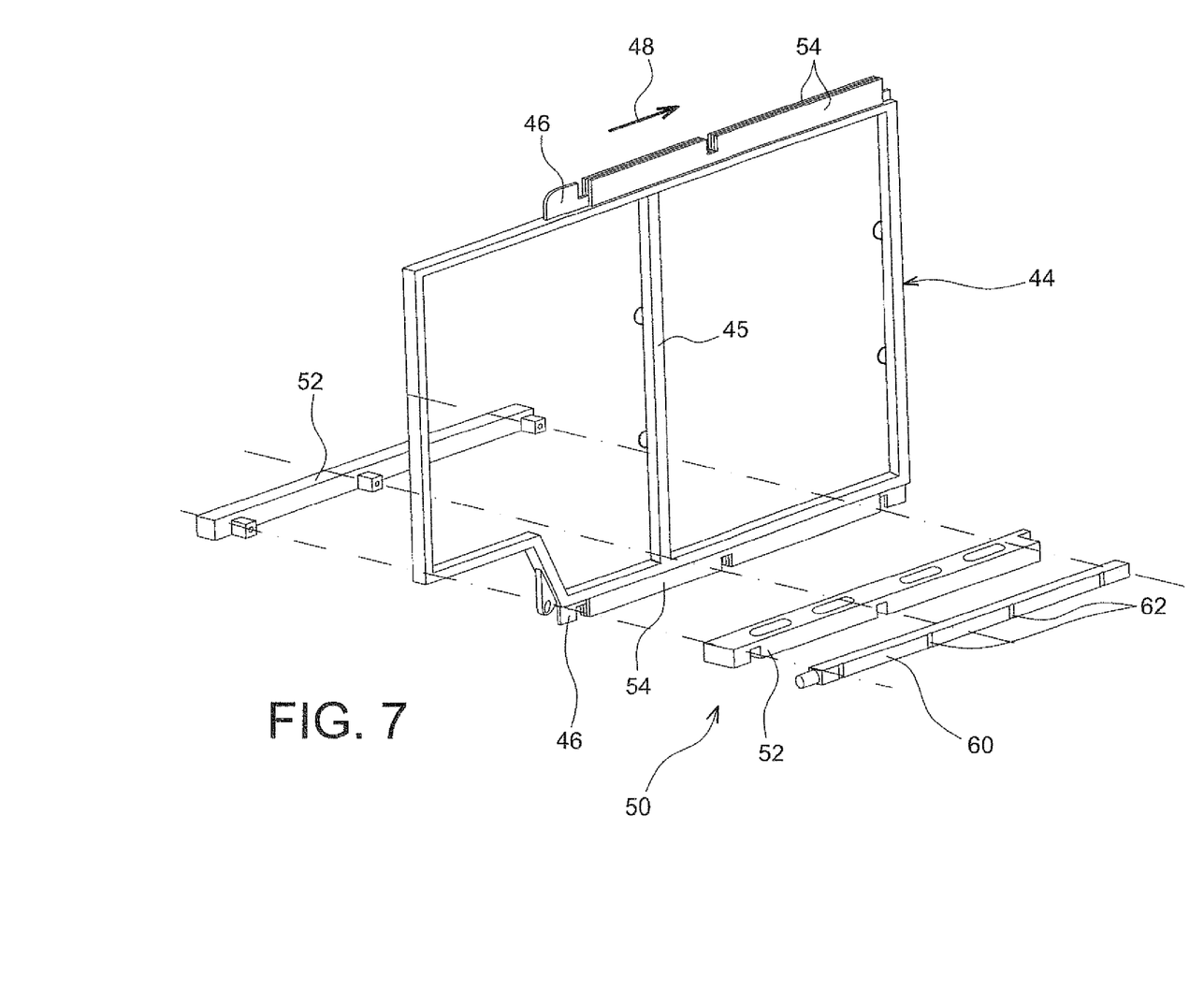
FIG. 7 depicts an exploded perspective view of a part of the electronic board shown in the preceding figure, without its printed circuit.

FIG. 6 depicts the electronic board 10 in greater detail. It comprises a printed circuit 40 in the form of a circuit board, and electronic components 42 shown only schematically and connected by soldering to the printed circuit. The printed circuit 40 has a substantially rectangular shape, possibly having a recess 41 at one of its corners. Along a rear side of the printed circuit, is mounted the connector 34 which is intended to plug into the connector 4 of the chassis of the equipment. With reference to FIGS. 6 and 7 jointly, the board 10 also has a reinforcing surround 44 attached fixedly to one face of the printed circuit 40, for example by screwing. The surround 44, preferably made from a different material from that of the circuit, such as aluminum 2017A for example, runs along the outline of the printed circuit, therefore being situated at the periphery thereof. Its purpose is to reduce the deformations suffered by the board 10 under vibrational stress, notably in the critical zones sensitive to deformations and to relative movements between the components 42. A transverse branch 45 connecting two opposite sides of the surround may possibly be provided, to enhance the rigidity.

On the upper and lower opposite sides of the surround 44 there is a flange 46 projecting towards the outside of the surround from the sole thereof. The sole and the flanges 46 are preferably made as a single piece. Furthermore, the flanges 46 are arranged in planes parallel to that of the printed circuit 40, and preferably in a plane that coincides with that of this same circuit 40. By way of indication, each flange 46 extends over a length corresponding to approximately 50 to 100% of the total length of the board in a direction 48 corresponding to the direction of the lower and upper opposite sides of the surround 44. This direction 48 also corresponds to the direction in which the board 10 is plugged into the chassis.

To allow the board 10 to be plugged into the chassis by sliding in this way, it is therefore equipped with a slide rail 50 on each of the two, lower and upper, opposite sides of the surround 44. This slide rail 50, preferably produced as an assembly of various components as will be explained later on, is designed to form means of retaining the board in the chassis. As shown in the case of the lower rail 50 of FIG. 6, it is intended to collaborate with the guide rail 30 of the lower wall 26 of the equipment chassis, this rail 30 then forming complementary retention means. Similarly, the upper slide rail 50 is intended to collaborate with a guide rail of the upper wall 16 of the chassis.

In the embodiment depicted, the guide rail 30 forming the slideway constitutes a female part into which the slide rail 50 constituting a male part is inserted. The opposite solution could have been envisaged without departing from the scope of the invention. In addition, the rail portions that collaborate with one another to retain the board 10 in the chassis may be of varying geometries, for example of substantially square or rectangular cross section as has been depicted, or of more complex geometry such as a dovetail geometry. In any event, collaboration between the rails 30, 50 provides not only retention of the board 10 in the chassis 15 during operation, but also allows the removable board 10 to be inserted/extracted by sliding, in the plug-in direction 48.

Figure 8:
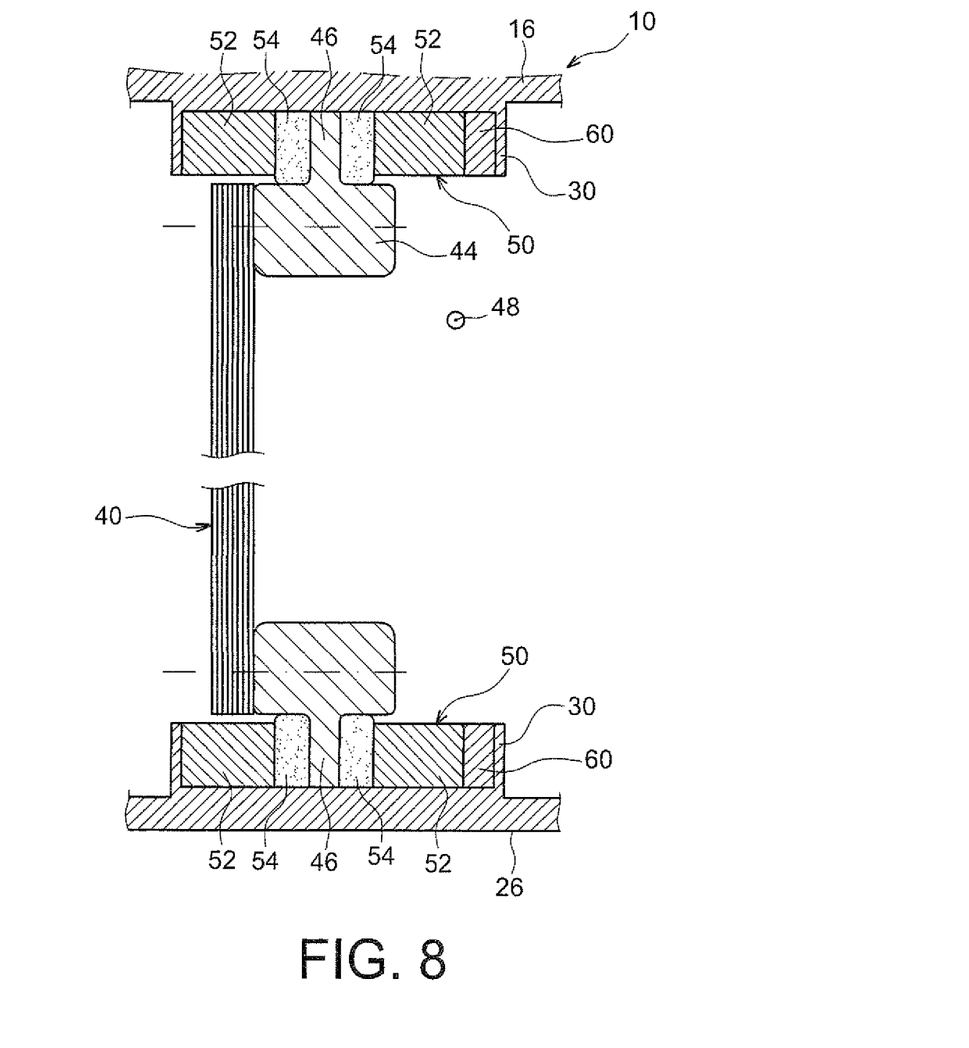
FIG. 8 depicts a view in cross section of the electronic board shown in FIGS. 6 and 7.

With reference more specifically to FIGS. 7 and 8, in the region of each slide rail 50 that collaborates with a corresponding guide rail 30, there are means specific to the present invention that improve the resistance of the board 10 to vibration. These are vibration damping means which are interposed between the reinforcing surround 44 and the constituent elements of the rail 50, used for connecting the board 10 to the chassis of the equipment.

Each rail 50 has two longilinear mechanical components 52, each the length of the rail, corresponding substantially to the length of the associated flange 46. These two components 52 are arranged respectively one on each side of the flange 46 of the surround, parallel to this flange. However, rather than providing direct contact between these mechanical components 52 and the flange 46, a coating 54 of vibration damping material is interposed at each of the two interfaces. These then are first and second vibration damping means pressed against the flange 46.

Each coating 54 adopts the form of a block, of a layer, of a mat or the like, depending on the needs encountered. The two mechanical components 52 are mounted to press on one another, for example using screw fastening, trapping the two damping coatings 54 and the flange 46 between them. Thus, each coating 54, preferably made of a polymer material, is compressed between the flange 46 and its associated mechanical component 52. In this respect, it is noted that the polymer material has a density, in the neutral state, of between 0.8 g/cm$^3$ and 1.8 g/cm$^3$ and is compressed between the flange 46 and the components 52 with a compression ratio of the order of 15 to 25% and, more preferably, of the order of 20%. That allows the transmission of vibrations/accelerations to the electronic board to be reduced still further.

Each coating 54 is therefore pressed against the flange 46 of the surround 44, and rests on the sole of this surround, the thickness of which exceeds that of the flange projecting outwards from this sole. Furthermore, the components 52 of the rail 50 are retained on the surround 44 only as a result of friction against the coatings 54 or possibly by bonding thereto. In particular, no direct mechanical connection between this rail 50 and the reinforcing surround 44 is provided.

The rail 50 formed by the two longilinear mechanical components 52 therefore does not transmit to the surround 44 all of the accelerations/vibrations that it experiences as the vibration damping coatings 54 are carefully positioned to filter out some of these. The mechanical resistance of the board 10 and of its components is thereby improved.

As mentioned earlier, the two slide rails 50, arranged on the two opposite sides of the reinforcing surround, are parallel in this instance to allow the board 10 to be inserted/extracted by the sliding of these rails 50 on the guide rails 30 of the chassis of the equipment 2, in the plug-in direction 48.

The mechanical components 52 are supplemented by a locking piece 60, which is likewise longilinear, of a length substantially identical to that of the components 52. The locking piece 60 is mounted fixedly, for example by screwing, on the outer edge of one of the components 52 so that it is able to collaborate with one of the flanks of the corresponding rail 30, as can best be seen in FIG. 8. The pressing of this locking piece 60 against the flank of the rail 30 allows a clamped retention that limits the relative movements between the board and the chassis. Notched lateral cutouts provide locking in the guide rail 30. The locking piece 60 is also referred to as "locking slideway."

It is therefore the combination of the three parts 52, 60 that leads to the overall shape of the rail 50, even though the locking piece 60 could be incorporated into one of the mechanical clamping components 52, without departing from the scope of the invention.

Figure 9:
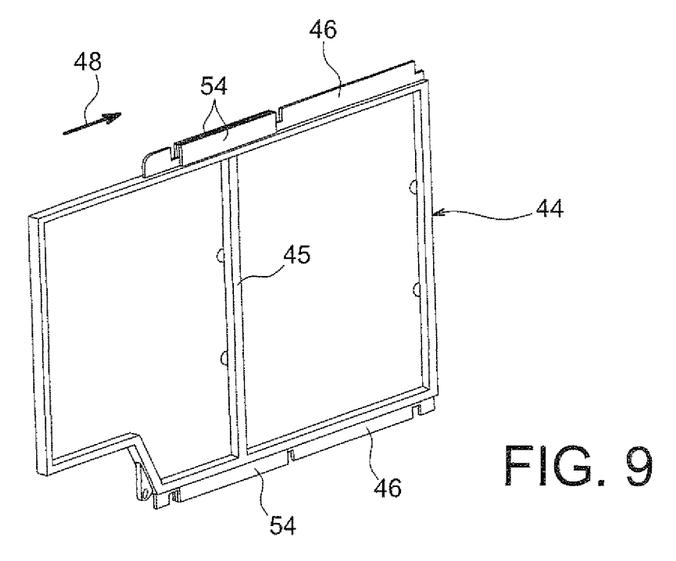
FIGS. 9 and 10 show views similar to that of FIG. 7, according to alternative forms of embodiment.
Figure 10:
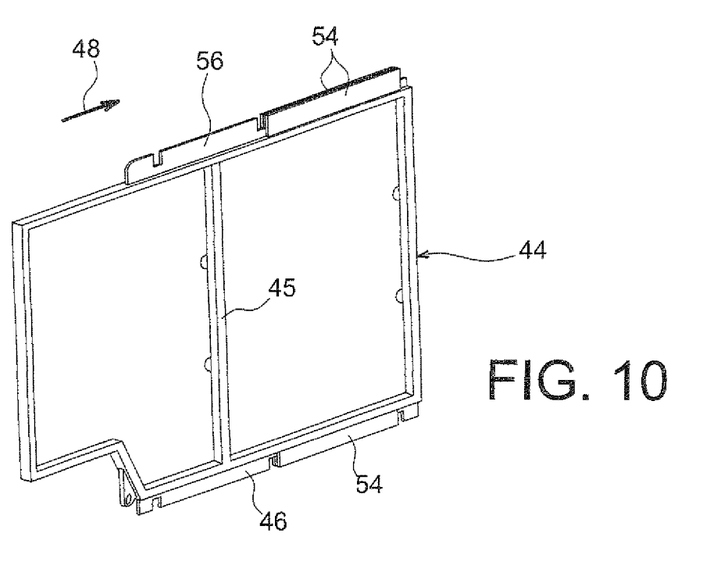

It should be noted that the specific feature of the invention may be applied to one or more of the electronic boards 10 of the same item of equipment 2, depending on the needs encountered. The features of the vibration damping coating 54, such as the dimensions, the nature of the material or even the compression ratio, can vary from one board to another and/or from one side of each board to the other, as can their location on the reinforcing surround 44. In this respect, FIGS. 9 and 10 show two alternative forms of embodiment in which the vibration damping coatings 54 do not extend substantially from one end of each flange 48 to the other but extend respectively only over the front part or over the rear part. In such instances, the coatings 54 may extend over a length corresponding to under 50% of the overall length of the board in the plug-in direction 48.

Of course, various modifications can be made by the person skilled in the art to the invention which has just been described by way of nonlimiting examples only.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. An electronic board for avionics equipment, the board comprising:
   a printed circuit,
   a reinforcing surround provided on at least a portion of each peripheral side of the printed circuit, the reinforcing surround including an outwardly projecting flange,
   board retention means, mounted to said flange, said board retention means comprising two mechanical components clamping said flange, and
   vibration damping means pressed on at least one side of the outwardly projecting flange between the reinforcing surround and the board retention means,
   wherein the flange, the vibration dampening means, and the board retention means are configured and arranged to move with the board as the board is inserted/extracted to/from a chassis, and
   wherein the vibration dampening means is compressed between the flange and the board retention means.

2. The electronic board according to claim 1, wherein said vibration damping means comprises at least one coating of vibration damping material.

3. The electronic board according to claim 2, wherein said vibration damping material is a polymer material.

4. The electronic board according to claim 2, wherein said vibration damping material has a density, in the neutral state, of between 0.8 g/cm$^3$ and 1.8 g/cm$^3$ and is compressed between the reinforcing surround and the retention means.

5. The electronic board according to claim 1, wherein the vibration damping means comprises a first and second vibration damping means that are pressed on either side of the outwardly projecting flange.

6. The electronic board according to claim 1, wherein said board retention means additionally comprises a locking piece configured and arranged to lock the board in position, with respect to the avionics equipment, in cooperation with complementary retention means belonging to the avionics equipment, said locking piece being attached to at least one of said two mechanical components.

7. The electronic board according to claim 1, further comprising two board retention means arranged respectively on two opposite sides of the reinforcing surround.

8. The electronic board according to claim 1, wherein said board retention means is configured and arranged in the overall form of a rail.

9. The electronic board according to claim 1, further comprising electronic components connected to the printed circuit, and a board connector.

10. The electronic board according to claim 1, wherein:
   the flange extends in a longitudinal direction;
   the two mechanical components each comprise a member that extends in the same longitudinal direction as the flange;
   the vibration dampening means comprises first and second polymer material layers, wherein the first polymer material layer is provided between a first side of the flange and one of the two mechanical components and the second polymer material layer is provided between a second side of the flange and the other of the two mechanical components; and
   the two mechanical components are mounted to each other via fasteners, thereby trapping the first and second polymer materials and the flange between the two mechanical components, and whereby there is no direct mechanical connection between the mechanical components and the reinforcing surround.

11. An avionics equipment comprising:
   a chassis equipped with complementary retention means,
   at least one electronic board for avionics equipment, the board comprising:
      a printed circuit,
      a reinforcing surround provided on at least a portion of each peripheral side of the printed circuit, the reinforcing surround including an outwardly projecting flange,
      board retention means, mounted to said flange, said board retention means comprising two mechanical components clamping said flange, and
      vibration damping means pressed on at least one side of the outwardly projecting flange between the reinforcing surround and the board retention means, and
   wherein said electronic board is housed in the chassis by collaboration between the board retention means and said complementary retention means of said chassis, and
   wherein the flange, the vibration dampening means, and the board retention means are configured and arranged to move with the board as the board is inserted/extracted to/from the chassis, and
   wherein the vibration dampening means is compressed between the flange and the board retention means.

12. The avionics equipment according to claim 11, wherein the chassis has an opening opposite a chassis backplane, the opening being delimited in part by two opposite walls each one extending as far as the chassis backplane, each electronic board having two retention means respectively collaborating with two complementary retention means provided on the two opposite walls.

13. The avionics equipment according to claim 11, wherein the board retention means and the complementary retention means are designed to slide on one another in a plug-in direction of the board into the said chassis, the board retention means being configured and arranged in the overall form of a slide rail and the complementary retention means being configured and arranged the form of a guide rail guiding the slide rail.

14. The avionics equipment according to claim 11, wherein:
the flange extends in a longitudinal direction;
the two mechanical components each comprise a member that extends in the same longitudinal direction as the flange;
the vibration dampening means comprises first and second polymer material layers, wherein the first polymer material layer is provided between a first side of the flange and one of the two mechanical components and the second polymer material layer is provided between a second side of the flange and the other of the two mechanical components; and
the two mechanical components are mounted to each other via fasteners, thereby trapping the first and second polymer materials and the flange between the two mechanical components, and whereby there is no direct mechanical connection between the mechanical components and the reinforcing surround.

15. An avionics rack module comprising:
a support chair including an avionics connector that is electrically connected to an electrical network of an airplane,
at least one item of electronic equipment comprising:
a chassis equipped with complementary retention means, wherein the chassis is configured and arranged to be seated upon the support chair,
at least one electronic board for avionics equipment, wherein the board is configured and arranged to be plugged into the avionics connector of the support chair, the board comprising:
a printed circuit,
a reinforcing surround provided on at least a portion of each peripheral side of the printed circuit, the reinforcing surround including an outwardly projecting flange,
board retention means, mounted to said flange, said board retention means comprising two mechanical components clamping said flange, and
vibration damping means pressed on at least one side of the outwardly projecting flange between the reinforcing surround and the board retention means,
wherein said electronic board is housed in the chassis by collaboration between the board retention means and said complementary retention means of said chassis, and
a cooling air duct running along each item of electronic equipment, and
wherein the flange, the vibration dampening means, and the board retention means are configured and arranged to move with the board as the board is inserted/extracted to/from the chassis.

16. The avionics rack module according to claim 15, wherein the vibration dampening means is compressed between the flange and the board retention means.

17. The avionics rack module according to claim 15, wherein:
the flange extends in a longitudinal direction;
the two mechanical components each comprise a member that extends in the same longitudinal direction as the flange;
the vibration dampening means comprises first and second polymer material layers, wherein the first polymer material layer is provided between a first side of the flange and one of the two mechanical components and the second polymer material layer is provided between a second side of the flange and the other of the two mechanical components; and
the two mechanical components are mounted to each other via fasteners, thereby trapping the first and second polymer materials and the flange between the two mechanical components, and whereby there is no direct mechanical connection between the mechanical components and the reinforcing surround.

* * * * *